United States Patent
Ge

(10) Patent No.: US 10,797,267 B2
(45) Date of Patent: Oct. 6, 2020

(54) PACKAGE STRUCTURE, MANUFACTURING METHOD FOR THE SAME, AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventor: Lin Ge, Beijing (CN)

(73) Assignees: CHENGDU BOE OPTOELECTRONICS TECHNOLOGY CO., LTD., Chengdu, Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/329,547

(22) PCT Filed: May 16, 2018

(86) PCT No.: PCT/CN2018/087129
§ 371 (c)(1),
(2) Date: Feb. 28, 2019

(87) PCT Pub. No.: WO2019/024569
PCT Pub. Date: Feb. 7, 2019

(65) Prior Publication Data
US 2019/0198814 A1  Jun. 27, 2019

(30) Foreign Application Priority Data
Aug. 1, 2017  (CN) .......................... 2017 1 0646937

(51) Int. Cl.
*H01L 51/52* (2006.01)
*H01L 27/32* (2006.01)
(Continued)

(52) U.S. Cl.
CPC ........ *H01L 51/5259* (2013.01); *B01D 53/261* (2013.01); *B01D 53/28* (2013.01);
(Continued)

(58) Field of Classification Search
CPC ............... H01L 51/5259; H01L 51/524; H01L 51/5246; H01L 27/3244; H01L 51/5256;
(Continued)

(56) References Cited

U.S. PATENT DOCUMENTS

| 6,395,578 B1 | 5/2002 | Shin et al. |
| 6,624,568 B2 | 9/2003 | Silvernail |

(Continued)

FOREIGN PATENT DOCUMENTS

| CN | 1505442 A | 6/2004 |
| CN | 1536938 A | 10/2004 |

(Continued)

OTHER PUBLICATIONS

First Office Action dated Sep. 4, 2018 corresponding to Chinese application No. 201710646937.X.

(Continued)

*Primary Examiner* — Su C Kim
(74) *Attorney, Agent, or Firm* — Nath, Goldberg & Meyer; Joshua B. Goldberg

(57) ABSTRACT

The present disclosure provides a package structure, a manufacturing method for the same, and a display device. The package structure includes a substrate, an organic light emitting device disposed on the substrate, and an encapsulation film layer disposed above the organic light emitting device, the encapsulation film layer encapsulating the organic light emitting device onto the substrate, wherein an adsorption structure is formed in the encapsulation film layer, and the adsorption structure is configured to absorb moisture and oxygen.

17 Claims, 2 Drawing Sheets

(51) Int. Cl.
 H01L 51/56 (2006.01)
 B01D 53/26 (2006.01)
 B01D 53/28 (2006.01)
(52) U.S. Cl.
 CPC ........ *H01L 27/3244* (2013.01); *H01L 51/524* (2013.01); *H01L 51/5246* (2013.01); *H01L 51/5256* (2013.01); *H01L 51/56* (2013.01); *B01D 2253/112* (2013.01); *B01D 2253/202* (2013.01); *B01D 2253/25* (2013.01); *B01D 2253/304* (2013.01); *B01D 2253/308* (2013.01); *H01L 2251/558* (2013.01)
(58) Field of Classification Search
 CPC . H01L 51/56; H01L 2251/558; B01D 53/261; B01D 53/28; B01D 2253/308; B01D 2253/112; B01D 2253/202; B01D 2253/25; B01D 2253/304
 See application file for complete search history.

(56) References Cited

U.S. PATENT DOCUMENTS

2003/0117066 A1 6/2003 Silvernail
2012/0195004 A1* 8/2012 Miller ................ G06F 1/20
 361/705
2017/0084867 A1* 3/2017 Lim ................ H01L 27/3244
2018/0047930 A1* 2/2018 Lee ................ H01L 51/0018

FOREIGN PATENT DOCUMENTS

| | | |
|---|---|---|
| CN | 1592508 A | 3/2005 |
| CN | 1592514 A | 3/2005 |
| CN | 204720454 U | 10/2015 |
| CN | 105047831 A | 11/2015 |
| CN | 106328819 A | 1/2017 |
| CN | 107464888 A | 12/2017 |
| DE | 102006060722 A1 | 4/2008 |
| JP | 200208673 A | 7/2000 |

OTHER PUBLICATIONS

Second Office Action dated Mar. 21, 2019 corresponding to Chinese application No. 201710646937.X.
Third Office Action dated Jun. 3, 2019 corresponding to Chinese application no. 201710646937.X.
International Search Report dated Aug. 15, 2018 corresponding to application No. PCT/CN2018/087129.

* cited by examiner forming the organic light emitting device on the substrate forming an encapsulation film layer above the organic light emitting device to encapsulate the organic light emitting device onto the substrate while forming a water-oxygen absorption structure in the encapsulation film layer

PACKAGE STRUCTURE, MANUFACTURING METHOD FOR THE SAME, AND DISPLAY DEVICE

CROSS-REFERENCE TO RELATED APPLICATION

This is a National Phase Application filed under 35 U.S.C. 371 as a national stage of PCT/CN2018/087129, filed May 16, 2018, and claims priority to Chinese Application No. 201710646937.X filed on Aug. 1, 2017, the disclosure of which is hereby incorporated by reference in its entirety.

TECHNICAL FIELD

The present disclosure relates to the field of display technologies, and in particular, to a package structure and a manufacturing method for the same, and a display device.

BACKGROUND

In a novel flexible organic light emitting display device (AMOLED), both of an organic light emitting material layer and a cathode formed by an active metal are very sensitive to moisture and oxygen, and a small amount of moisture or oxygen intruding into the device can cause rapid decay and aging of the device, therefore the light emitting display device has high requirements for preventing moisture and oxygen. Therefore, the organic light emitting display device places high demands on packaging processes and conditions.

SUMMARY

An embodiment of the present disclosure provides a package structure including: a substrate; an organic light emitting device disposed on the substrate; an encapsulation film layer disposed above the organic light emitting device, the encapsulation film layer encapsulating the organic light emitting device onto the substrate, wherein an adsorption structure is formed in the encapsulation film layer, and the adsorption structure is configured to absorb moisture and oxygen.

In some implementations, the adsorption structure includes a plurality of pores, and the plurality of pores are uniformly distributed in the encapsulation film layer.

In some implementations, each of the pores has a size ranging from 0.1 nm to 10 nm.

In some implementations, a volume ratio of the pores in the encapsulation film layer per unit volume ranges from 10% to 40%.

In some implementations, the encapsulation film layer has a thickness ranging from 50 nm to 70 nm.

In some implementations, each of the pores is partially filled with an inert gas.

In some implementations, the encapsulation film layer is made of an alkali metal halide composite material or an organic polymer resin material.

In some implementations, the package structure includes an organic encapsulation layer and an inorganic encapsulation layer, wherein the organic encapsulation layer and the inorganic encapsulation layer are sequentially stacked on the encapsulation film layer.

In some implementations, the package structure further includes an organic encapsulation layer and an inorganic encapsulation layer, wherein the organic encapsulation layer and the inorganic encapsulation layer are sequentially stacked on a side of the organic light emitting device away from the substrate, and the encapsulation film layer is interposed between the organic encapsulation layer and the inorganic encapsulation layer.

In some implementations, the package structure includes more than one encapsulation film layer, more than one organic encapsulation layer and more than one inorganic encapsulation layer.

An embodiment of the present disclosure provides a display device including the above package structure.

An embodiment of the present disclosure provides a manufacturing method for a package structure, wherein the package structure includes a substrate, an organic light emitting device, and a first encapsulation film layer, the manufacturing method including: forming the organic light emitting device on the substrate; forming the first encapsulation film layer above the organic light emitting device to encapsulate the organic light emitting device onto the substrate, wherein an adsorption structure is formed in the first encapsulation film layer, and the adsorption structure is configured to absorb moisture and oxygen.

In some implementations, forming the first encapsulation film layer includes: forming the first encapsulation film layer adopting an alkali metal halide composite material by using an evaporation method.

In some implementations, forming the first encapsulation film layer includes: forming the first encapsulation film layer adopting an organic polymer resin material by using a printing method or a spin coating method.

In some implementations, the adsorption structure includes a plurality of pores, and forming the first encapsulation film layer further includes: during the evaporation process, an inert gas is introduced into a material, which is to be evaporated to form the first encapsulation film layer, to form the pores in the first encapsulation film layer.

In some implementations, a flow rate of the inert gas introduced into the material to be evaporated ranges from 1 sccm to 10 sccm, an evaporation ambient pressure is not less than 1.0E-5 Pa, and an evaporation rate ranges from 4 U/s to 5 U/s.

In some implementations, the manufacturing method further includes sequentially forming a first inorganic encapsulation layer and a first organic encapsulation layer on the first encapsulation film layer.

In some implementations, the manufacturing method further includes: before forming the first encapsulation film layer, forming a first inorganic encapsulation layer on the organic light emitting device to encapsulate the organic light emitting device onto the substrate; and after forming the first encapsulation film layer, forming a first organic encapsulation layer on the first encapsulation film layer, wherein forming the first encapsulation film layer further includes forming the first encapsulation film layer on the first inorganic encapsulation layer.

In some implementations, the manufacturing method further includes: before forming the first encapsulation film layer, forming a first inorganic encapsulation layer above the organic light emitting device to encapsulate the organic light emitting device onto the substrate; after forming the first encapsulation film layer, forming a first organic encapsulation layer on the first encapsulation film layer; forming a second encapsulation film layer on the first organic encapsulation layer; and forming a second inorganic encapsulation film layer on the second encapsulation film layer, wherein forming the first encapsulation film layer further includes forming the first encapsulation film layer on the first inorganic encapsulation layer.

In some implementations, forming the first encapsulation film layer further includes: forming the first encapsulation film layer adopting an alkali metal halide composite material by using an evaporation method, wherein during the evaporation process, an inert gas is introduced into a material, which is to be evaporated to form the first encapsulation film layer by the evaporation method, to form pores in the first encapsulation film layer.

In some implementations, forming the second encapsulation film layer further includes: forming the second encapsulation film layer adopting an alkali metal halide composite material by using an evaporation method, wherein during the evaporation process, an inert gas is introduced into a material, which is to be evaporated to form the second encapsulation film layer by the evaporation method, to form pores in the second encapsulation film layer.

DETAILED DESCRIPTION

In order to enable a person skilled in the art to better understand the technical solutions of the present disclosure, a package structure and a manufacturing method for the same and a display device provided by the present disclosure are further described in detail below with reference to the accompanying drawings and specific embodiments.

Figure 1:
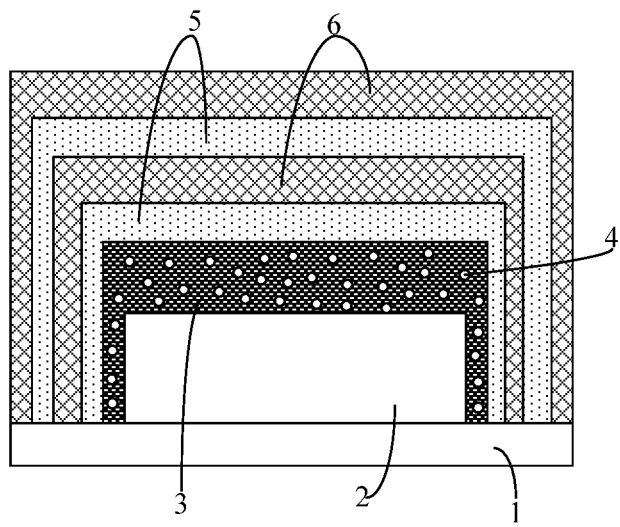
FIG. 1 is a cross-sectional view showing a configuration of a package structure according to an embodiment of the present disclosure.

An embodiment of the present disclosure provides a package structure, as shown in FIG. 1, which includes a substrate 1 and an organic light emitting device 2 disposed on the substrate 1, and an encapsulation film layer 3 covering the organic light emitting device 2 and being configured to encapsulate the organic light emitting device 2 onto the substrate 1, wherein an adsorption structure is formed in the encapsulation film layer 3. In the present embodiment, the adsorption structure may specifically be a water-oxygen absorption structure 4, and the water-oxygen absorption structure 4 can absorb moisture and oxygen.

According to an embodiment of the present disclosure, the substrate 1 is a flexible substrate, and the package structure is a flexible structure. By forming the water-oxygen absorption structure 4 in the encapsulation film layer 3, moisture and oxygen in the package structure can be absorbed, thereby avoiding the organic light emitting device 2 from being corroded and damaged by moisture and oxygen, thereby improving package quality for the organic light emitting device 2 and prolonging the lifetime of the organic light emitting device 2.

In the present embodiment, the water-oxygen absorption structure 4 includes a plurality of pores, and the plurality of pores are uniformly distributed in the encapsulation film layer 3. The uniformly distributed pores in the encapsulation film layer 3 can absorb, accommodate and enclose moisture and oxygen in the package structure, thereby preventing moisture and oxygen from directly contacting the organic light emitting device 2 to corrode or damage the organic light emitting device 2, which in turn improves the package quality for the organic light emitting device 2, while also prolonging lifetime of the organic light emitting device 2.

In the present embodiment, a size of each of the pores ranges from 0.1 nm to 10 nm. The pore of this size can well absorb, accommodate and enclose moisture and oxygen inside the package structure, so as to avoid the organic light emitting device 2 from being corroded and damaged by moisture and oxygen.

In the present embodiment, a volume ratio of the pores in the encapsulation film layer 3 per unit volume ranges from 10% to 40%. The volume ratio of the pores is favorable for sufficiently absorbing, accommodating and enclosing moisture and oxygen inside the package structure, so as to avoid the organic light emitting device 2 from being corroded and damaged by moisture and oxygen.

In the present embodiment, a thickness of the encapsulation film layer 3 ranges from 50 nm to 70 nm. The thickness of the encapsulation film layer 3 can achieve sufficient absorption and enclosing of moisture and oxygen inside the package structure to avoid the organic light emitting device 2 from being corroded and damaged by moisture and oxygen.

In the present embodiment, the pores are partially filled with an inert gas. On the one hand, the inert gas facilitates the formation of pores in the encapsulation film layer 3, and on the other hand, since the pores are partially filled with the inert gas, the moisture and oxygen can enter the remaining space of the pores, preventing the moisture and oxygen from contacting the organic light emitting device 2. In addition, since the inert gas itself does not react with the cathode or anode made of active metal and the organic light emitting material in the organic light emitting device 2, therefore it can block the moisture and oxygen from the organic light emitting device 2, blocking the moisture and oxygen from directly contacting the organic light emitting device 2, further avoiding the organic light emitting device 2 from being corroded and damaged by moisture and oxygen, without affecting the organic light emitting device 2.

In the present embodiment, the encapsulation film layer 3 is made of an alkali metal halide composite material. It should be noted that the encapsulation film layer 3 may also be made of an organic polymer resin material. The encapsulation film layer 3 made of each of the above materials is advantageous in forming pores therein. Among the above materials, the organic polymer resin material may be one or more of an aromatic polyamine resin material and a polyamide resin material.

In the present embodiment, the package structure further includes an organic encapsulation layer 5 and an inorganic encapsulation layer 6, and the organic encapsulation layer 5 and the inorganic encapsulation layer 6 are sequentially stacked on the encapsulation film layer 3. The organic encapsulation layer 5 is made of a conventional organic material such as polyurethane, polyethylene or polyvinyl chloride, and the inorganic encapsulation layer 6 is made of a conventional inorganic material such as silicon nitride, silicon oxide or silicon oxynitride. The arrangement of the organic encapsulation layer 5 and the inorganic encapsulation layer 6 can further block the intrusion of the moisture and oxygen in the environment into the interior of the package structure, thereby avoiding the organic light emitting device 2 from being corroded and damaged by moisture and oxygen.

It should be noted that more than one organic encapsulation layer 5 and more than one inorganic encapsulation layer 6 may be provided, and organic encapsulation layers 5 and inorganic encapsulation layers 6 may be alternately stacked on the encapsulation film layer 3 to form a plurality of encapsulations for the organic light emitting device 2 to prevent the moisture and oxygen in the environment from entering the interior of the package structure.

Figure 3:
FIG. 3 is a flow chart of a manufacturing method for a package structure according to an embodiment of the present disclosure.

Based on the above configuration of the package structure in the present embodiment, the present embodiment further provides a manufacturing method for a package structure, as shown in FIG. 3, the manufacturing method includes forming an organic light emitting device on a substrate, forming an encapsulation film layer above the organic light emitting device to encapsulate the organic light emitting device onto the substrate while forming a water-oxygen absorption structure in the encapsulation film layer.

In the present embodiment, the encapsulation film layer may be made of an alkali metal halide composite material by an evaporation method.

The water-oxygen absorption structure includes a plurality of pores, and during the evaporation process, an inert gas is introduced into a material, which is to be evaporated to form the encapsulation film layer by the evaporation method, to form the pores in the encapsulation film layer. A flow rate of the inert gas introduced into the material to be evaporated is in a range from 1 sccm to 10 sccm. An evaporation ambient pressure is not less than 1.0E-5 Pa and an evaporation rate is in a range from 4 U/s to 5 U/s. Under the above-mentioned process environment and process conditions, a plurality of uniformly distributed pores can be formed in the encapsulation film layer, and the pores can sufficiently absorb, accommodate and enclose the moisture and oxygen inside the package structure to avoid the light emitting device from being corroded and damaged by the moisture and oxygen.

It should be noted that the encapsulation film layer of the organic polymer resin material may be formed by printing or spin coating. Specifically, after the encapsulation film layer is printed or spin coated, the encapsulation film layer is cured or dried, and finally an encapsulation film layer having pores therein is formed. A temperature for curing or drying is in a range from 80° C. to 100° C., and a time for curing or drying is in a range from 30 minutes to 60 minutes.

In addition, the manufacturing method for the package structure further includes sequentially forming an organic encapsulation layer and an inorganic encapsulation layer on the encapsulation film layer. The organic encapsulation layer is formed by a conventional printing or spin coating method, and the inorganic encapsulation layer is formed by a conventional chemical vapor deposition method, and details thereof are not described herein.

Figure 2:
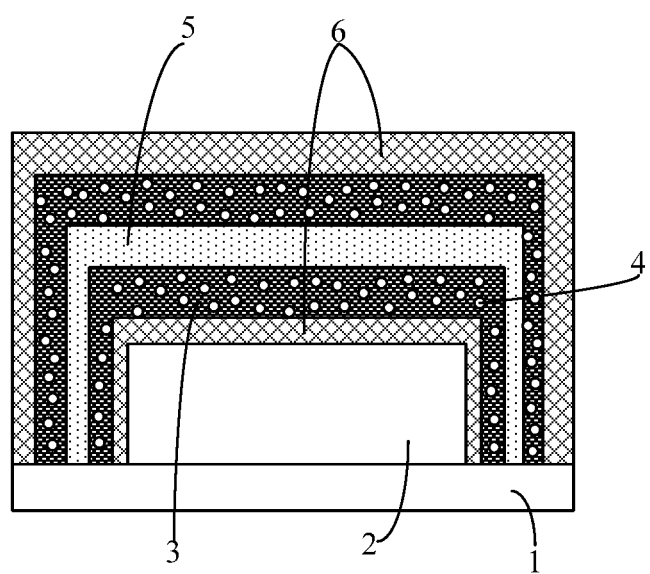
FIG. 2 is a cross-sectional view showing the configuration of a package structure according to another embodiment of the present disclosure.

According to another embodiment of the present disclosure, a package structure includes a substrate 1 and an organic light emitting device 2 disposed on the substrate 1, the package structure further includes an organic encapsulation layer 5 and an inorganic encapsulation layer 6, the organic encapsulation layer 5 and the inorganic encapsulating layer 6 are provided above the organic light emitting device 2. Unlike the above embodiment, as shown in FIG. 2, the encapsulation film layer 3 is interposed between the organic encapsulation layer 5 and the inorganic encapsulation layer 6.

In this way, the encapsulation film layer 3 can also absorb, accommodate and enclose moisture and oxygen inside the package structure, and the organic encapsulation layer 5 and the inorganic encapsulation layer 6 can further encapsulate the organic light emitting device 2 to prevent the moisture and oxygen in the external environment from intruding into the interior of the package structure. The encapsulation film layer 3 can cooperate with the organic encapsulation layer 5 and the inorganic encapsulation layer 6 to better avoid the organic light emitting device 2 being corroded and damaged by the moisture and oxygen.

In the present embodiment, more than one encapsulation film layer 3, more than one organic encapsulation layer 5, and more than one inorganic encapsulation layer 6 may be provided. With such a configuration, it is possible to provide a multi-protection for the organic light emitting device 2, thus better preventing moisture and oxygen from invading into the inside of the package structure, thereby further improving the package quality for the organic light emitting device 2 and prolonging its lifetime.

Correspondingly, in the present embodiment, a manufacturing method for the above package structure is further provided. Different from the manufacturing method in the above embodiment, in the present manufacturing method, after the organic light emitting device is formed on the substrate, an organic encapsulation layer, an encapsulation film layer and an inorganic encapsulation layer are sequentially formed above the substrate. Specific manufacturing method of each film layer is the same as that in the above embodiment, and will not be described again.

Other structures of the package structure and the manufacturing method thereof in the present embodiment are the same as those in the above embodiment, and are not described herein again.

Advantageous effects of the embodiments in the present disclosure are as follows: in the package structure, by forming the water-oxygen absorption structure in the encapsulation film layer, moisture and oxygen in the package structure can be absorbed, thereby avoiding the organic light emitting device from being corroded and damaged by moisture and oxygen, thereby improving the package quality for the organic light emitting device and prolonging its lifetime.

The present disclosure also provides a display device including a package structure in accordance with an embodiment of the present disclosure.

By adopting the package structure of the embodiment of the present disclosure, the package quality of the display device is improved, and the lifetime of the display device is prolonged.

The display device provided by the present disclosure may be any product or component having a display function such as an OLED panel, an OLED TV, a display, a mobile phone, a navigator or the like.

It should be understood that, the foregoing embodiments are only exemplary embodiments used for explaining the principle of the present disclosure, but the present disclosure is not limited thereto. Various variations and modifications may be made by a person skilled in the art without departing from the spirit and essence of the present disclosure, and these variations and modifications also fall into the protection scope of the present disclosure.

The invention claimed is:
1. A package structure, comprising:
a substrate;
an organic light emitting device disposed on the substrate;
an encapsulation film layer disposed above the organic light emitting device, the encapsulation film layer encapsulating the organic light emitting device onto the substrate,
wherein an adsorption structure is formed in the encapsulation film layer, and the adsorption structure is configured to absorb moisture and oxygen,
wherein the adsorption structure comprises a plurality of pores, and the plurality of pores are uniformly distrib- uted in the encapsulation film layer, and each of the pores is partially filled with an inert gas.

2. The package structure according to claim 1, wherein each of the pores has a size ranging from 0.1 nm to 10 nm.

3. The package structure according to claim 1, wherein a volume ratio of the pores in the encapsulation film layer per unit volume ranges from 10% to 40%.

4. The package structure according to claim 1, wherein the encapsulation film layer has a thickness ranging from 50 nm to 70 nm.

5. The package structure according to claim 1, wherein the encapsulation film layer is made of an alkali metal halide composite material or an organic polymer resin material.

6. The package structure according to claim 1, further comprising an organic encapsulation layer and an inorganic encapsulation layer, wherein the organic encapsulation layer and the inorganic encapsulation layer are sequentially stacked on the encapsulation film layer.

7. The package structure according to claim 1, further comprising an organic encapsulation layer and an inorganic encapsulation layer, wherein the organic encapsulation layer and the inorganic encapsulation layer are sequentially stacked on a side of the organic light emitting device away from the substrate, and the encapsulation film layer is interposed between the organic encapsulation layer and the inorganic encapsulation layer.

8. The package structure according to claim 7, comprising more than one encapsulation film layer, more than one organic encapsulation layer and more than one inorganic encapsulation layer.

9. A display device, comprising the package structure of claim 1.

10. A manufacturing method for a package structure, wherein the package structure comprises a substrate, an organic light emitting device, and a first encapsulation film layer, the manufacturing method comprising:
    forming the organic light emitting device on the substrate;
    forming the first encapsulation film layer above the organic light emitting device to encapsulate the organic light emitting device onto the substrate,
    wherein an adsorption structure is formed in the first encapsulation film layer, and the adsorption structure is configured to absorb moisture and oxygen,
    wherein the adsorption structure comprises a plurality of pores, and forming the first encapsulation film layer further comprises:
    during the evaporation process, an inert gas is introduced into a material, which is to be evaporated to form the first encapsulation film layer, to form the pores in the first encapsulation film layer.

11. The manufacturing method according to claim 10, wherein forming the first encapsulation film layer comprises:
    forming the first encapsulation film layer adopting an alkali metal halide composite material by using an evaporation method.

12. The manufacturing method according to claim 10, wherein forming the first encapsulation film layer comprises:
    forming the first encapsulation film layer adopting an organic polymer resin material by using a printing method or a spin coating method.

13. The manufacturing method according to claim 10, further comprising sequentially forming a first inorganic encapsulation layer and a first organic encapsulation layer on the first encapsulation film layer.

14. The manufacturing method according to claim 10, further comprising:
    before forming the first encapsulation film layer, forming a first inorganic encapsulation layer above the organic light emitting device to encapsulate the organic light emitting device onto the substrate, and
    after forming the first encapsulation film layer, forming a first organic encapsulation layer on the first encapsulation film layer,
    wherein forming the first encapsulation film layer further comprises forming the first encapsulation film layer on the first inorganic encapsulation layer.

15. The manufacturing method according to claim 10, further comprising:
    before forming the first encapsulation film layer, forming a first inorganic encapsulation layer above the organic light emitting device to encapsulate the organic light emitting device onto the substrate;
    after forming the first encapsulation film layer, forming a first organic encapsulation layer on the first encapsulation film layer;
    forming a second encapsulation film layer on the first organic encapsulation layer; and
    forming a second inorganic encapsulation film layer on the second encapsulation film layer,
    wherein forming the first encapsulation film layer further comprises forming the first encapsulation film layer on the first inorganic encapsulation layer.

16. The manufacturing method according to claim 14, wherein forming the first encapsulation film layer further comprises:
    forming the first encapsulation film layer adopting an alkali metal halide composite material by using an evaporation method, wherein during the evaporation process, an inert gas is introduced into a material, which is to be evaporated to form the first encapsulation film layer by the evaporation method, to form pores in the first encapsulation film layer.

17. The manufacturing method according to claim 15, wherein forming the second encapsulation film layer further comprises:
    forming the second encapsulation film layer adopting an alkali metal halide composite material by using an evaporation method, wherein during the evaporation process, an inert gas is introduced into a material, which is to be evaporated to form the second encapsulation film layer by the evaporation method, to form pores in the second encapsulation film layer.

* * * * *